United States Patent
Cohen et al.

(10) Patent No.: US 9,449,820 B2
(45) Date of Patent: Sep. 20, 2016

(54) EPITAXIAL GROWTH TECHNIQUES FOR REDUCING NANOWIRE DIMENSION AND PITCH

(71) Applicant: International Business Machines Corporation, Armonk, NY (US)

(72) Inventors: Guy M. Cohen, Ossining, NY (US); Michael A. Guillorn, Yorktown Heights, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/578,833

(22) Filed: Dec. 22, 2014

(65) Prior Publication Data
US 2016/0181097 A1   Jun. 23, 2016

(51) Int. Cl.
| | | |
|---|---|---|
| H01L 21/02 | (2006.01) | |
| H01L 21/306 | (2006.01) | |
| H01L 29/06 | (2006.01) | |
| H01L 29/423 | (2006.01) | |
| H01L 29/161 | (2006.01) | |
| H01L 29/775 | (2006.01) | |
| H01L 29/10 | (2006.01) | |
| H01L 21/20 | (2006.01) | |
| H01L 29/66 | (2006.01) | |

(52) U.S. Cl.
CPC ... H01L 21/02603 (2013.01); H01L 21/02532 (2013.01); H01L 21/30604 (2013.01); H01L 29/068 (2013.01); H01L 29/1029 (2013.01); H01L 29/161 (2013.01); H01L 29/42392 (2013.01); H01L 29/775 (2013.01); H01L 21/2018 (2013.01); H01L 29/0673 (2013.01); H01L 29/66477 (2013.01)

(58) Field of Classification Search
None
See application file for complete search history.

(56) References Cited

U.S. PATENT DOCUMENTS

| | | | |
|---|---|---|---|
| 7,078,299 B2 * | 7/2006 | Maszara | A61F 5/3776 257/E21.562 |
| 7,642,578 B2 | 1/2010 | Lee et al. | |
| 7,884,004 B2 | 2/2011 | Bangsaruntip et al. | |
| 7,892,945 B2 | 2/2011 | Bedell et al. | |
| 8,384,069 B2 | 2/2013 | Pernel et al. | |

(Continued)

OTHER PUBLICATIONS

Lee et al., "Challenges in epitaxial growth of SiGe buffers on Si (111), (110), and (112)" Thin Solid Films 508 (2006) 136-139 (published Nov. 2005).

(Continued)

*Primary Examiner* — Andres Munoz
(74) *Attorney, Agent, or Firm* — Kenneth R. Corsello; Michael J. Chang, LLC

(57) ABSTRACT

Techniques for reducing nanowire dimension and pitch are provided. In one aspect, a pitch multiplication method for nanowires includes the steps of: providing an SOI wafer having an SOI layer separated from a substrate by a BOX, wherein the SOI layer includes Si; patterning at least one nanowire in the SOI layer, wherein the at least one nanowire as-patterned has a square cross-sectional shape with flat sides; growing epitaxial SiGe on the outside of the at least one nanowire using an epitaxial process selective for growth of the epitaxial SiGe on the flat sides of the at least one nanowire; removing the at least one nanowire selective to the epitaxial SiGe, wherein the epitaxial SiGe that remains includes multiple epitaxial SiGe wires having been formed in place of the at least one nanowire that has been removed.

8 Claims, 8 Drawing Sheets

(56) References Cited

U.S. PATENT DOCUMENTS

| 8,399,330 | B2 | 3/2013 | Liu et al. | |
|---|---|---|---|---|
| 8,441,043 | B2 | 5/2013 | Bangsaruntip et al. | |
| 8,575,009 | B2 | 11/2013 | Sleight et al. | |
| 9,093,508 | B1* | 7/2015 | Xiao | H01L 29/0665 |
| 2008/0135949 | A1* | 6/2008 | Lo | B82Y 10/00 257/401 |
| 2008/0142853 | A1* | 6/2008 | Orlowski | B82Y 10/00 257/287 |
| 2010/0203712 | A1* | 8/2010 | Coronel | B82Y 10/00 438/479 |
| 2012/0138886 | A1 | 6/2012 | Kuhn et al. | |
| 2014/0034908 | A1* | 2/2014 | Bangsaruntip | H01L 29/775 257/27 |
| 2014/0231914 | A1* | 8/2014 | Chang | H01L 29/66795 257/347 |

OTHER PUBLICATIONS

Zervas et al., "Top-down fabrication of very-high density vertically stacked silicon nanowire arrays with low temperature budget", Microelectronic Engineering 88 pp. 3127-3132 (Oct. 2011).

Ng et al., "Vertically Stacked Silicon Nanowire Transistors Fabricated by Inductive Plasma Etching and Stress-Limited Oxidation", IEEE Electron Device Letters, vol. 30, No. 5, pp. 520-522 (May 2009).

Sung et al., "High Performance 5nm radius Twin Silicon Nanowire MOSFET(TSNWFET) : Fabrication on Bulk Si Wafer, Characteristics, and Reliability," IEDM Technical Digest. IEEE International Electron Devices Meeting, pp. 717-720 (Dec. 2005).

Pauliac-Vaujour et al., "Hybrid high resolution lithography (e-beam/deep ultraviolet) and etch process for the fabrication of stacked nanowire metal oxide semiconductor field effect transistors", J. Vac. Sci. Technol. B 26, pp. 2583-2586 (Dec. 2008).

Wang et al, "Fabrication of vertically stacked single-crystalline Si nanowires using self-limiting oxidation", Nanotechnology 23 pp. 015307-1 to 015307-5 (2012) (Published Dec. 2011).

Fang et al., " Vertically Stacked SiGe Nanowire Array Channel CMOS Transistors", IEEE Electron Device Letters, vol. 28, No. 3, pp. 211-213 (Mar. 2007).

Dupré et al., "15nm-diameter 3D Stacked Nanowires with Independent Gates Operation: ΦFET", IEEE International Electron Devices Meeting (IEDM), pp. 1-4 (Dec. 2008).

Anonymous, "A Method and Structure to Increase Nanowire Device Density", IP.com No. IPCOM000219190D (Jun. 25, 2012).

* cited by examiner

Nanowires have a square shape with four flat sides epi-SiGe has rectangular shape Nanowires have a square shape with four flat sides epi-Si has rectangular shape

EPITAXIAL GROWTH TECHNIQUES FOR REDUCING NANOWIRE DIMENSION AND PITCH

FIELD OF THE INVENTION

The present invention relates to nanowire-based devices and more particularly, to epitaxial growth techniques for reducing nanowire dimension and pitch.

BACKGROUND OF THE INVENTION

Silicon nanowire field effect transistors (FETs) are attracting significant interest as an evolutionary follow on from a FINFET device structure. With nanowire-based FETs, the nanowires serve as channels that interconnect a source region and a drain region of the device. A gate surrounding the nanowires regulates electron flow through the channels. When the gate fully surrounds a portion of each of the nanowires, this is referred to as a gate-all-around device.

For nanowire FETs (and FINFETs), the wire-to-wire pitch, coupled with the wire diameter, are critical scaling parameters. However, current lithographic limitations are close to the border of what is required to implement these devices in a technology.

Therefore, improved techniques for reducing nanowire dimension and pitch would be desirable.

SUMMARY OF THE INVENTION

The present invention provides epitaxial growth techniques for reducing nanowire dimension and pitch. In one aspect of the invention, a pitch multiplication method for nanowires is provided. The pitch multiplication method includes the steps of: providing an semiconductor-on-insulator (SOI) wafer having an SOI layer separated from a substrate by a buried oxide (BOX), wherein the SOI layer includes silicon (Si); patterning at least one nanowire in the SOI layer, wherein the at least one nanowire as-patterned has a square cross-sectional shape with flat sides; growing epitaxial silicon germanium (SiGe) on the outside of the at least one nanowire using an epitaxial process selective for growth of the epitaxial SiGe on the flat sides of the at least one nanowire; removing the at least one nanowire selective to the epitaxial SiGe, wherein the epitaxial SiGe that remains includes multiple epitaxial SiGe wires having been formed in place of the at least one nanowire that has been removed.

In another aspect of the invention, another pitch multiplication method for nanowires is provided. The pitch multiplication method includes the steps of: providing an SOI wafer having an SOI layer separated from a substrate by a BOX, wherein the SOI layer includes SiGe; patterning at least one nanowire in the SOI layer, wherein the at least one nanowire as-patterned has a square cross-sectional shape with flat sides; growing epitaxial Si on the outside of the at least one nanowire using an epitaxial process selective for growth of the epitaxial Si on the flat sides of the at least one nanowire; and removing the at least one nanowire selective to the epitaxial Si, wherein the epitaxial Si that remains includes multiple epitaxial Si wires having been formed in place of the at least one nanowire that has been removed.

In yet another aspect of the invention, a field effect transistor (FET) device is provided. The FET device includes: an SOI wafer having an SOI layer separated from a substrate by a BOX; pads patterned in the SOI layer; epitaxial SiGe covering the pads; multiple epitaxial SiGe wires connecting the pads to form a ladder-like structure, wherein the epitaxial SiGe wires are suspended over the BOX; and a gate surrounding a portion of each of the epitaxial SiGe wires in a gate-all-around configuration, wherein the portion of each of the epitaxial SiGe wires surrounded by the gate serves as a channel region of the FET, and wherein portions of the epitaxial SiGe wires extending out from the gate and the pads serve as source and drain regions of the FET.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for reducing nanowire diameter and pitch. As will be apparent from the description that follows, the present techniques generally involve growth of an epitaxial material on the sides of a square nanowire followed by selective removal of the nanowire. The result is the production of four separate epitaxial wires (epi-wires) from a single starting nanowire. Thus, the present techniques provide what is essentially a pitch multiplication technique for nanowires that occurs in multiple dimensions (around the nanowires). For example, as provided below, the present techniques may be implemented to yield four epi-wires from each starting nanowire. In that case, the present process could be termed a pitch quadrupling technique. Alternatively, should there not be access to all four sides of the starting nanowire (e.g., such as when the starting nanowire is not fully released from the underlying buried oxide) then a fewer number of epi-wires will be generated. For instance, if the process yields three epi-wires from each starting nanowire then the process could be termed a pitch tripling technique. Further processing can be performed to smoothen the epi-wires (i.e., to make them round) and/or to thicken them. The selection of materials for the starting nanowire and the epi-wires is configured such that the starting nanowire can be etched selectively to the epi-wires. By way of example only, exemplary embodiments will be presented below wherein epi-silicon germanium (SiGe) wires are grown on a starting silicon (Si) nanowire or the other way around, where epi-Si wires are grown on a starting SiGe nanowire.

A first exemplary embodiment of the present techniques is now described by way of reference to FIGS. 1-9 wherein the starting nanowires are Si nanowires. To begin the process, nanowire(s) 106 and pads 108 are patterned in a semiconductor-on-insulator (SOI) layer of a SOI wafer. In this case the SOI wafer is a silicon-on-insulator wafer (i.e., the SOI layer of the SOI wafer is formed from silicon). An alternative embodiment will be described below wherein the SOI layer is SiGe, i.e., the starting platform for the nanowire and pad formation is a SiGe-on-insulator wafer.

Figure 1:
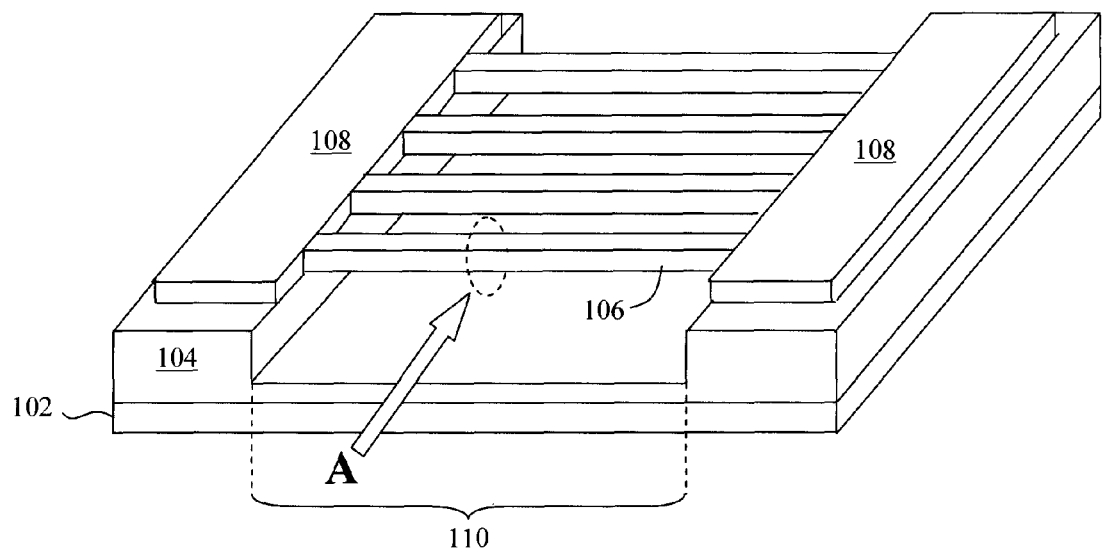
FIG. 1 is a three-dimensional diagram illustrating silicon (Si) nanowire(s) and pads having been patterned in a semiconductor-on-insulator (SOI) layer of a SOI wafer over a buried oxide (BOX) wherein the nanowires are suspended over the BOX according to an embodiment of the present invention.

Generally, the SOI wafers described herein include a SOI layer separated from a substrate (e.g., substrate 102) by a buried oxide (or BOX) (e.g., BOX 104). According to an exemplary embodiment, the substrate 102 is a silicon substrate and the BOX is formed from silicon dioxide ($SiO_2$). The nanowires 106 and pads 108 can be formed in the SOI layer using, for example, conventional lithography (e.g., optical or e-beam) followed by reactive ion etching (RIE). As shown in FIG. 1, one possible configuration of the nanowires 106 and pads 108 is a ladder-like structure wherein the nanowires 106 connect the pads 108 like the rungs of a ladder. The present techniques are however more generally applicable to any nanowire configuration including, e.g., those having a single nanowire and/or those where pads are provided to each nanowire individually.

As shown in FIG. 1, the nanowires 106 are suspended over the BOX 104. Specifically, a portion 110 of the BOX 104 is recessed beneath the nanowires 106. Techniques that may be employed to suspend the nanowires 106 by recessing or undercutting a portion 110 of the BOX 104 are described, for example, in U.S. Pat. No. 7,884,004 issued to Bangsaruntip et al., entitled "Maskless Process for Suspending and Thinning Nanowires" (hereinafter "U.S. Pat. No. 7,884,004"), the contents of which are incorporated by reference as if fully set forth herein. For example, it is described in U.S. U.S. Pat. No. 7,884,004 that the nanowires can be suspended (released from the BOX) by etching the BOX and recessing the BOX under the nanowires. In this manner, the nanowires 106 would form a suspended bridge between the pads 108. As described in U.S. Pat. No. 7,884,004, recessing of the BOX can be achieved with a diluted hydrofluoric (DHF) etch. The DHF etch is isotropic. The lateral component of the etching undercuts the BOX under the narrow nanowires, however the large SOI pads are not released and remain attached to the BOX.

According to one exemplary embodiment of the present techniques the nanowires are fully released from the underlying BOX in this manner in order to permit growth of the epi-wires on all now-exposed four sides of the nanowires 106. It is further notable that, as shown in FIG. 1, the as-patterned nanowires 106 have a square shape (i.e., with four flat sides). This configuration will permit selective growth of the epi-wires on only the flat surfaces of the nanowires 106—see below. In an alternative exemplary embodiment presented below, the starting nanowires are not released from the underlying BOX prior to growth of the epi-wires. In that case, only three sides (i.e., top and two sides) of the starting nanowire are exposed. As a result, in that case three epi-wires will be produced (i.e., the present process is a pitch tripling process).

Optionally, the pads may be doped with boron prior to performing any epi growth (see below) to enhance selectivity during the subsequent etch process used to selectively remove the nanowires. Specifically, removal of the nanowires selective to the pads will be performed later in the process. While the pads will at that point be encapsulated in epi-SiGe (and thus protected during the Si-selective etch performed on the nanowires), any additional measures to enhance selectivity are desirable.

Figure 2:
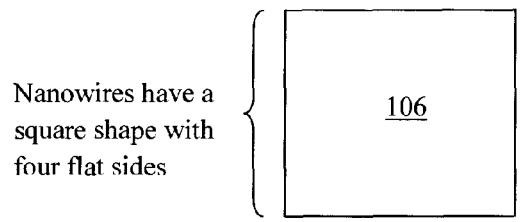
FIG. 2 is a cross-sectional diagram illustrating the Si nanowires having a square cross-sectional shape with flat surfaces according to an embodiment of the present invention.
Figure 3:
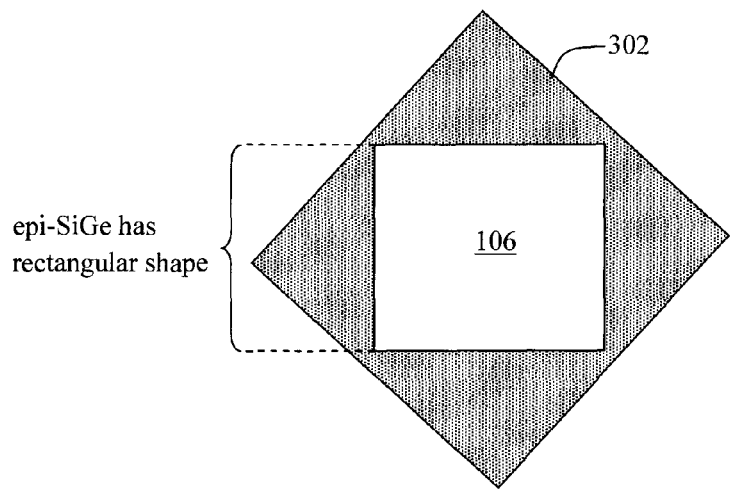
FIG. 3 is a cross-sectional diagram illustrating epi-silicon germanium (SiGe) ("epi-SiGe") having been grown on the flat surfaces of the Si nanowires according to an embodiment of the present invention.

For ease and clarity of description, the depictions in the figures will now shift to that of a cross-sectional cut through one of the nanowires 106. Specifically, what is depicted in FIGS. 2, 3, etc. is a cross-sectional cut A through one of the suspended nanowires 106 (see FIG. 1). It is to be understood however that the process applies in the same manner described to each of the nanowires present (for example the steps are performed simultaneously across all of the nanowires), and the steps would appear the same for each of the nanowires present.

Thus, what is depicted in FIG. 2 is a cross-section of one of the nanowires 106. As shown in FIG. 2, the nanowires 106 have a square (cross-sectional) shape with four flat sides. It is on these flat surfaces/sides which selective growth of the epi-wires will be performed.

Specifically, as shown in FIG. 3, epitaxial SiGe ("epi-SiGe") 302 is grown on the outside of the nanowires 106. The growth is selective for forming epi-SiGe 302 on the flat surfaces of the nanowires 106. As a result of this selective growth the epi-SiGe on each flat surface of the nanowires 106 takes on a rectangular cross-sectional shape. It is these rectangular epi-SiGe structures that will ultimately form the epi-wires, one for each side of the nanowire 106. Thus for each nanowire 106 four epi-SiGe wires will be produced.

According to an exemplary embodiment, the epitaxial growth process employed is selective for epi-SiGe growth on (111) planes, which in the as-patterned nanowires 106 correspond to the flat sides of the nanowires. According to the Miller index, (111) denotes a specific plane in the crystal lattice of a material. As known in the art, epi-film growth rate is highly dependent on surface orientation, and that dependence can vary depending on the temperature. See, for example, Lee et al., "Challenges in epitaxial growth of SiGe buffers on Si (111), (110), and (112)" Thin Solid Films 508 (2006) 136-139 (published November 2005), the contents of which are incorporated by reference as if fully set forth herein. Thus, the growth conditions can be selected (which is within the capabilities of one skilled in the art) to favor epi growth on the flat (111) sides of the nanowires 106. In that case, epi-SiGe growth will occur as long as there are (111) planes present. Once there are no (111) planes present, the growth stops. This selective growth process would result in the rectangle-shaped epi-SiGe on the flat sides of nanowires 106 as shown in FIG. 3.

Figure 4:
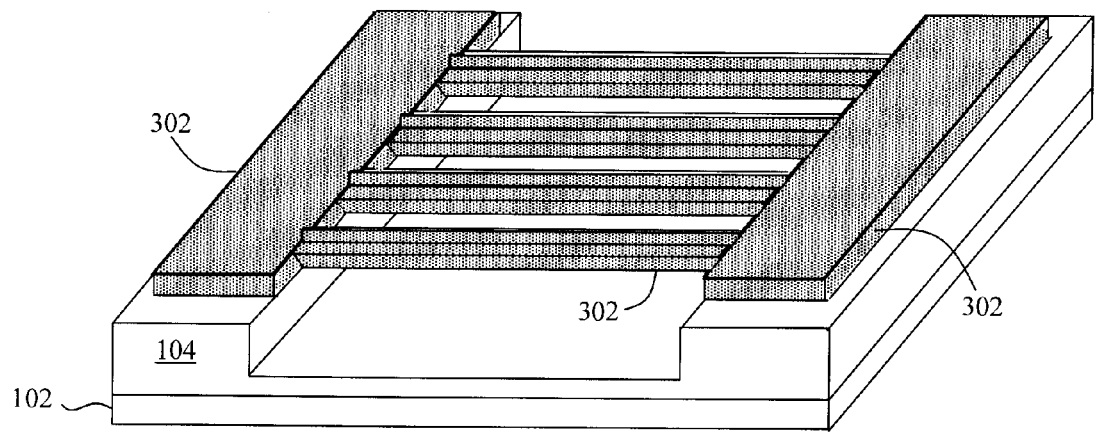
FIG. 4 is a three-dimensional diagram illustrating how the epi-SiGe is formed on both the Si nanowires and on the pads according to an embodiment of the present invention.
Figure 4A:
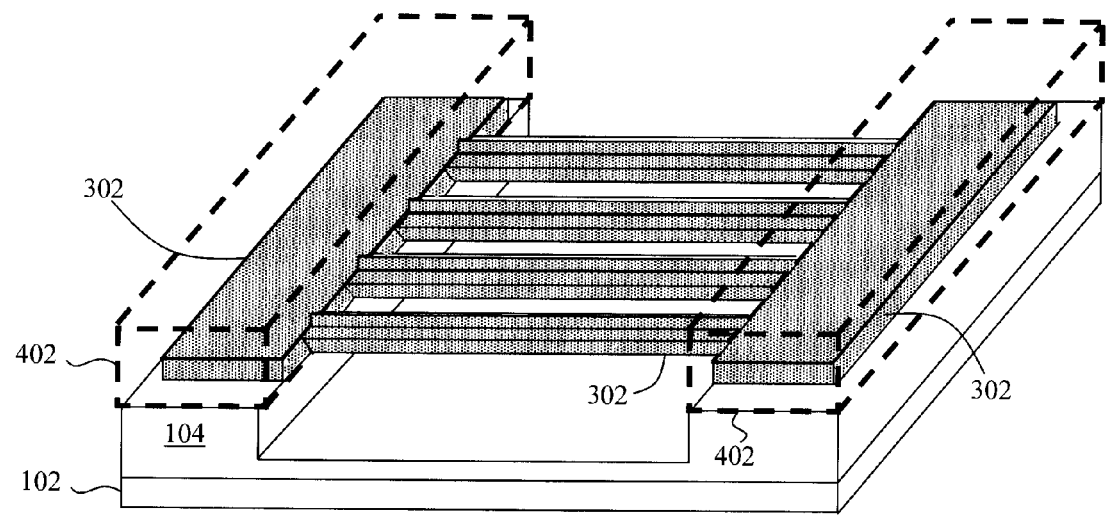
FIG. 4A is a three-dimensional diagram illustrating an optional mask on the pads to protect the pads during subsequent etching steps according to an embodiment of the present invention.
Figure 5:
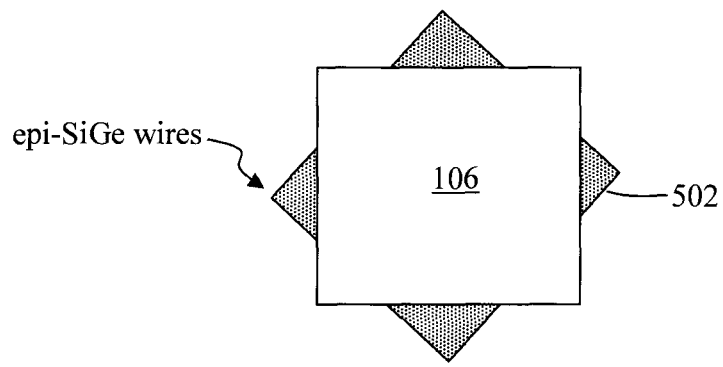
FIG. 5 is a cross-sectional diagram illustrating an etching of the epi-SiGe having been performed to expose the Si nanowires according to an embodiment of the present invention.
Figure 6:
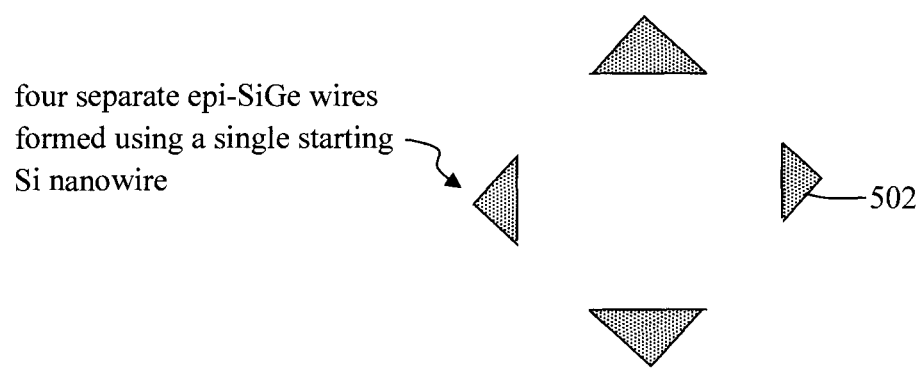
FIG. 6 is a cross-sectional diagram illustrating the Si nanowires having been removed selective to the epi-SiGe wires according to an embodiment of the present invention.

It is notable that during this epi-SiGe growth step epi-SiGe 302 will also be deposited on the flat surfaces of the pads. Switching back briefly to a three-dimensional view, FIG. 4 illustrates the formation of the epi-SiGe 302 on both the nanowires 106 and on the pads 108. The growth of epi-SiGe 302 on the pads is desirable for a number of reasons. First, this epi-SiGe 302 will serve to connect the epi-wires to the pads once the nanowires 106 are removed as described below. Second, the epi-SiGe 302 on the pads will encapsulate and protect the integrity of the pads during the etch back of the epi-SiGe 302 (FIG. 5) and/or during the Si selective etch used to remove the nanowires 106 (FIG. 6). However, in order to insure protection of the pads during these etching steps, it may be desirable to place a protective mask (e.g., silicon oxide or silicon nitride mask) on the pads prior to the etch. The use of an optional pad mask 402 is shown illustrated in FIG. 4A. The pad mask provides an extra level of protection which may be needed to prevent the new epi-wires from being unanchored and floating away (depending on details of epi growth on the corner where the epi-wires meet the pads, which are hard to predict). The pad mask 402 may be formed by depositing the desired mask material and then patterning the mask using standard lithography and etching techniques. Alternatively, the pad masks 402 may be placed later in the process, i.e., after the epi-wire etch back but prior to performing the etch to remove the nanowires.

Although selective, the epitaxial growth process will likely leave the nanowires 106 encapsulated in the epi-SiGe 302. Thus in order to permit selective removal of the nanowire 106 from the epi-SiGe 302, an etching of the epi-SiGe 302 is next performed to expose the (Si) nanowires 106. See FIG. 5. According to an exemplary embodiment, this etching back of the epi-SiGe 302 is performed using an isotropic etching process selective for SiGe. By way of example only, a SiGe selective wet etching process such as ammonium hydroxide with hydrogen peroxide ($NH_4OH$:$H_2O_2$) or $H_2O_2$ can be employed. The etch can be timed to remove only enough of the epi-SiGe 302. Alternatively, an HCl chemical vapor etch may be employed to etch back the epi-SiGe. As a result, portions of the epi-SiGe 302 will remain on the four flat surfaces of the nanowires 106. These portions are the epi-SiGe wires, i.e., epi-SiGe wires 502 in FIG. 5. It is notable that, depending on the selectivity of the etch, some portion of the (Si) nanowires might be affected. However, any small amount of etching of the nanowires 106 during this step is inconsequential.

The next step is to remove the nanowires 106 selective to the epi-SiGe wires 502. See FIG. 6. It is notable that the optional pad mask 402 depicted in FIG. 4A (if desired, but not already present) may instead be formed prior to performing the nanowire removal etch depicted in FIG. 6. As described above, the pad masks 402 serve as an extra level of protection to prevent the newly formed epi-wires from being unanchored and floating away during the etch.

According to an exemplary embodiment, the (Si) nanowires 106 are removed selective to the epi-SiGe wires 502 using a wet etching process, such as a wet etch in tetramethylammonium hydroxide (TMAH). As shown in FIG. 6, the result is four separate epi-wires 502 having been formed in place of each of the single original (Si) nanowires 106 removed. As shown in FIG. 6, the epi-SiGe wires 502 each have a reduced dimension (e.g., a reduced cross-sectional area—compare FIG. 6 with FIG. 2) as compared to the original starting nanowire 106. As provided above, the presence of the epi-SiGe 302 on the pads 108 serves to encapsulate and protect the pads 108 during this (Si-selective) nanowire etch. The additional pad masks 402, if present, can provide an extra level of protection. Following the etch to remove the nanowires, the optional pad masks (if present) can then be removed.

Figure 7:
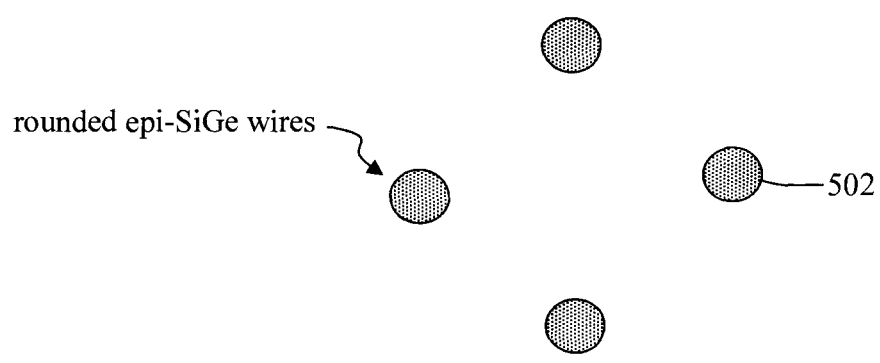
FIG. 7 is a cross-sectional diagram illustrating the epi-SiGe wires having been re-shaped to give them a round cross-sectional shape according to an embodiment of the present invention.

Additional processing of the epi-wires 502 may be performed, if so desired. For instance, as shown in FIG. 7, the epi-wires 502 may be re-shaped to give them a round cross-sectional shape. Suitable techniques for reshaping nanowires are described in U.S. Pat. No. 7,884,004. By way of example only, as provided in U.S. Pat. No. 7,884,004 an annealing process can be used to reshape the nanowires wherein the SOI wafer is contacted with an inert gas at a temperature, pressure and for a duration sufficient to cause silicon to migrate from the nanowires to the pads. Suitable inert gases include any gas that does not react with silicon, e.g., hydrogen ($H_2$), xenon (Xe), helium (He) and potentially others. According to an exemplary embodiment, the inert gas anneal is performed with a gas pressure of from about 30 torr to about 1000 torr, at a temperature of from about 600 degrees Celsius (° C.) to about 1100° C. and for a duration of from about one minute to about 120 minutes. It is notable that SiGe reflow (so as to reshape the epi-wires) happens at a lower temperature than Si, depending on the germanium (Ge) content, but is well within the temperature ranges specified in U.S. Pat. No. 7,884,004 for Si nanowires. Thus applying the techniques described in U.S. Pat. No. 7,884,004 would be well suited to achieve reshaping of the present epi-SiGe wires.

As shown in FIG. 7, the reshaping process also serves to thin the epi-wires 502. Thus, if so desired, an SiGe-epi growth process can be used to expand out the epi-wires 502 to increase their diameter. See FIG. 8. Increasing a diameter of the epi-wires (Dwire) may be desirable to: a) avoid quantum mechanical effects for a Dwire less than or equal to about 5 nanometers (nm), and b) increase the channel perimeter in a given footprint. However, it is preferable to control the epi expansion so as not to merge the separate epi-SiGe wires back into a single wire.

Figure 8:
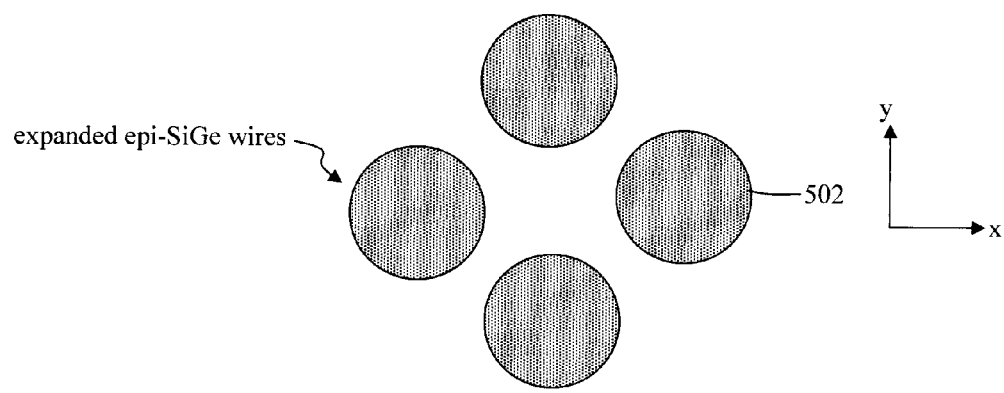
FIG. 8 is a cross-sectional diagram illustrating an SiGe-epi growth process having been used to expand out the epi-SiGe wires to increase their diameter according to an embodiment of the present invention.

As provided above, the present teachings provide a pitch multiplication technique for nanowires that occurs in multiple dimensions (around the nanowires). As illustrated in FIG. 8 for instance, where there was once a single (Si) nanowire 106, there are now (a group of) four separate epi-SiGe wires. As shown in FIG. 8, as a result of the present process two of these epi-SiGe wires are adjacent to one another in the x-direction, and the other two of these epi-SiGe wires are adjacent to one another in the y-direction.

Figure 9:
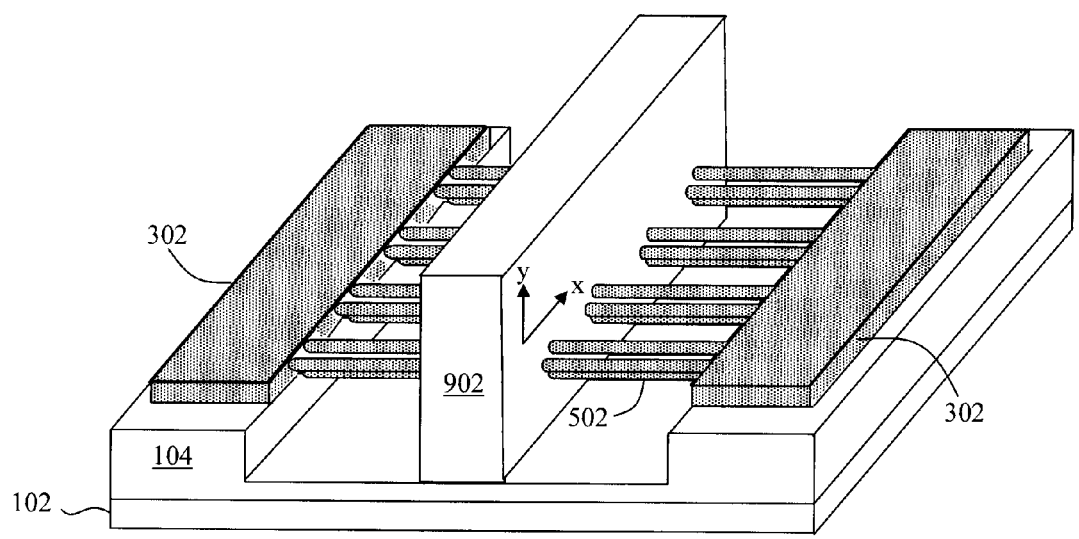
FIG. 9 is a three-dimensional diagram illustrating a gate having been formed surrounding at least a portion of each of the epi-SiGe wires in a gate-all-around configuration according to an embodiment of the present invention.

This resulting structure can then be used as the platform for a variety of different nanowire-based device configurations. For illustrative purposes only, a non-limiting example of a nanowire FET is shown illustrated in FIG. 9. In the example shown in FIG. 9, a gate 902 is formed surrounding at least a portion of each of the epi-SiGe wires 502 in a gate-all-around configuration. These portions of the epi-SiGe wires 502 surrounded by the gate 902 will serve as a channel region of the FET, whereas portions of the epi-SiGe wires 502 extending out from the gate 902, and the pads will serve as source and drain regions of the FET. In the exemplary embodiment illustrated in FIG. 9, there are multiple "groupings" of the epi-SiGe wires. These groups are the result of the above-described process wherein multiple epi-SiGe wires 502 are formed around the original nanowires 106. As shown in FIG. 9, each of the groups contains four epi-SiGe wires 502—two of which are adjacent to one another in the x-direction, and another two of which are adjacent to one another in the y-direction.

As provided above, the present techniques may also be implemented using the reverse system, wherein the starting nanowires (and pads) are formed from SiGe and epi-Si wires are grown. It is notable that the same general process as described above would be implemented in this alternative embodiment just substituting SiGe for Si, and vice-versa. However, for completeness, this exemplary alternative embodiment is shown illustrated in FIGS. 10-16.

To begin the process, nanowire(s) 1006 and pads 1008 are patterned in an SOI layer of a SOI wafer. In this case the SOI wafer is a SiGe-on-insulator wafer (i.e., the SOI layer of the SOI wafer is formed from SiGe). In this example, the SiGe SOI layer is separated from a substrate 1002 by a BOX 1004. See FIG. 10. Processes for patterning the nanowires and pads in the SOI layer were provided above.

Figure 10:
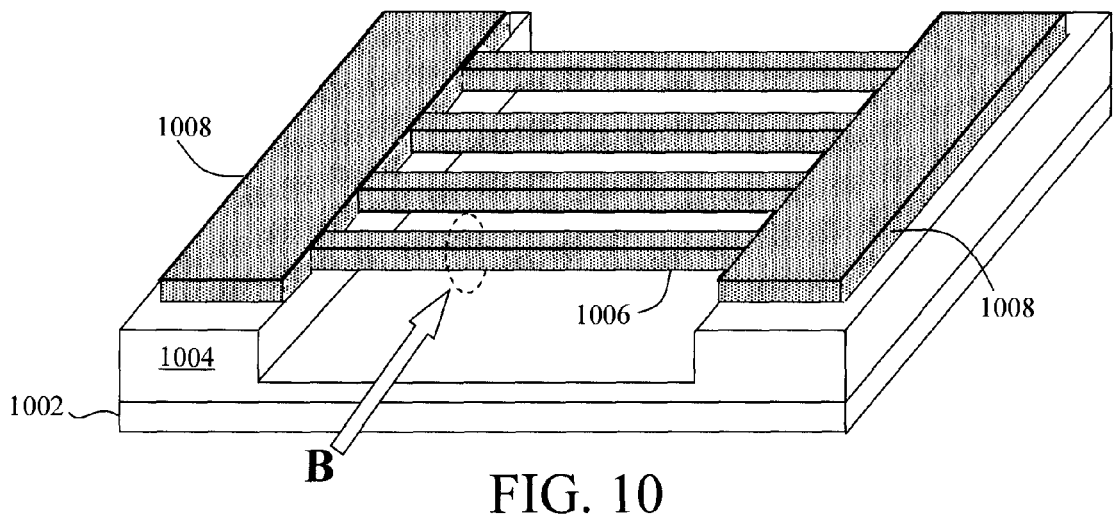
FIG. 10 is a three-dimensional diagram illustrating SiGe nanowire(s) and pads having been patterned in a SOI layer of a SOI wafer over a BOX wherein the nanowires are suspended over the BOX according to an embodiment of the present invention.

As shown in FIG. 10, one possible configuration of the nanowires 1006 and pads 1008 is a ladder-like structure wherein the nanowires 1006 connect the pads 1008 like the rungs of a ladder. The present techniques are however more generally applicable to any nanowire configuration including, e.g., those having a single nanowire and/or those where pads are provided to each nanowire individually. As in the example above, the nanowires 1006 are suspended over the BOX 1004.

Figure 11:
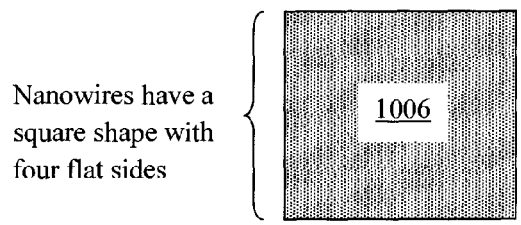
FIG. 11 is a cross-sectional diagram illustrating the SiGe nanowires having a square cross-sectional shape with flat surfaces according to an embodiment of the present invention.
Figure 12:
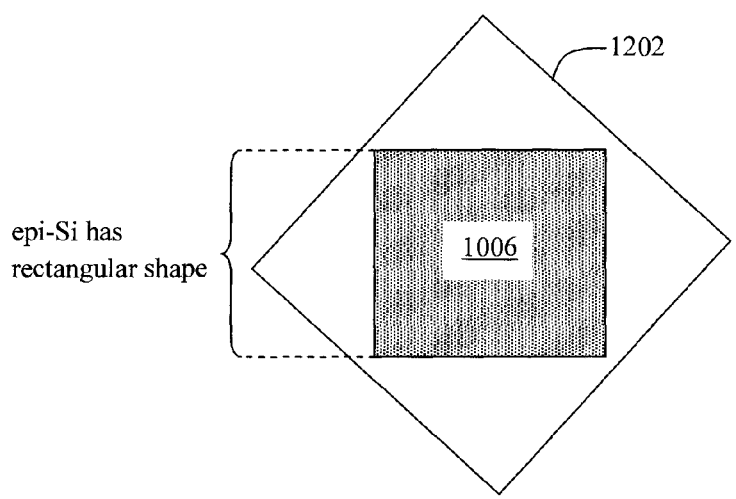
FIG. 12 is a cross-sectional diagram illustrating epi-Si having been grown on the flat surfaces of the SiGe nanowires according to an embodiment of the present invention.
Figure 13:
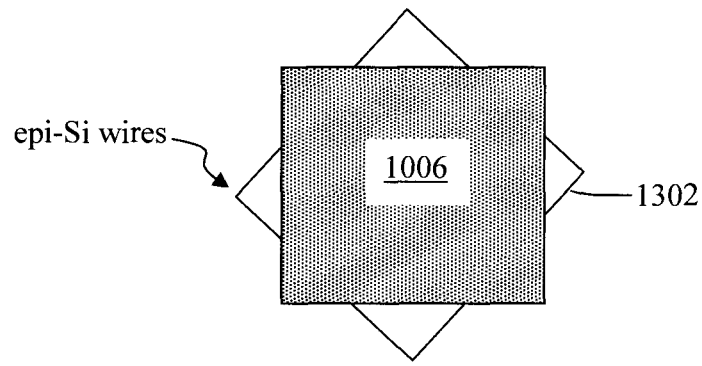
FIG. 13 is a cross-sectional diagram illustrating an etching of the epi-Si having been performed to expose the SiGe nanowires according to an embodiment of the present invention.

For ease and clarity of description, the depictions in the figures will now shift to that of a cross-sectional cut through one of the nanowires 1006. Specifically, what is depicted in FIGS. 11, 12, etc. is a cross-sectional cut B through one of the suspended nanowires 1006 (see FIG. 10). Thus, what is depicted in FIG. 11 is a cross-section of one of the nanowires 1006. As shown in FIG. 11, the nanowires 1006 have a square (cross-sectional) shape with four flat sides on which selective growth of the epi-Si wires will be performed.

Specifically, as shown in FIG. 12, epitaxial Si ("epi-Si") 1202 is grown on the outside of the nanowires 1006. The growth is selective for forming epi-Si 1202 on the flat surfaces of the nanowires 1006 and, as described above the epi-Si on each flat surface of the nanowires 1006 takes on a rectangular cross-sectional shape. In this example it is these rectangular epi-Si structures that will ultimately form the epi-Si wires, one for each side of the nanowires 1006. Thus for each nanowire 1006 four epi-Si wires will be produced. The process for selective epitaxial growth on the flat surfaces of a nanowire was provided above.

Although selective, the epitaxial growth process will likely leave the nanowires 1006 encapsulated in the epi-Si 1202. Thus in order to permit selective removal of the nanowire 1006 from the epi-Si 1202, an etching of the epi-Si 1202 is next performed to expose the (SiGe) nanowires 1006. See FIG. 13. According to an exemplary embodiment, this etching back of the epi-Si 1202 is performed using an isotropic etching process selective for Si. By way of example only, a Si selective wet etching process such as phosphoric acid can be employed. The etch can be timed to remove only enough of the epi-Si 1202. As a result, portions of the epi-Si 1202 will remain on the four flat surfaces of the nanowires 1006. These portions are the epi-Si wires, i.e., epi-SiGe wires 1302 in FIG. 13.

Figure 14:
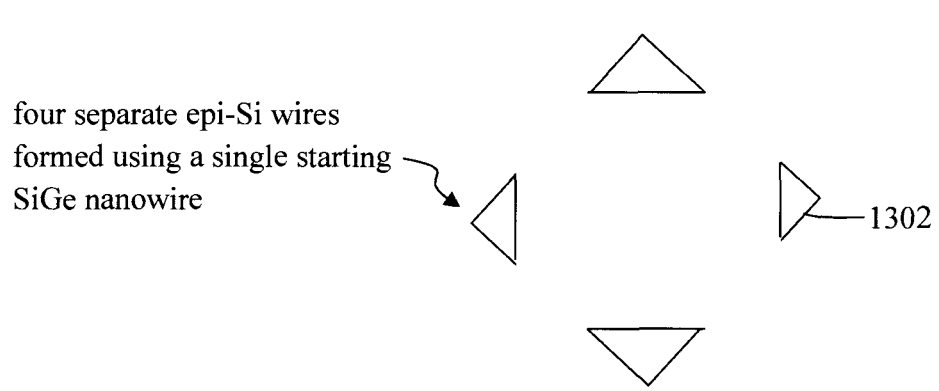
FIG. 14 is a cross-sectional diagram illustrating the SiGe nanowires having been removed selective to the epi-Si wires according to an embodiment of the present invention.

The next step is to remove the nanowires 1006 selective to the epi-Si wires 1302. See FIG. 14. According to an exemplary embodiment, the (SiGe) nanowires 1006 are removed selective to the epi-Si wires 1302 using a wet etch, such as $NH_4OH:H_2O_2$ or $H_2O_2$. As shown in FIG. 14, the result is four separate epi-Si wires 1302 having been formed in place of each of the single original (SiGe) nanowires 1006 removed.

Figure 15:
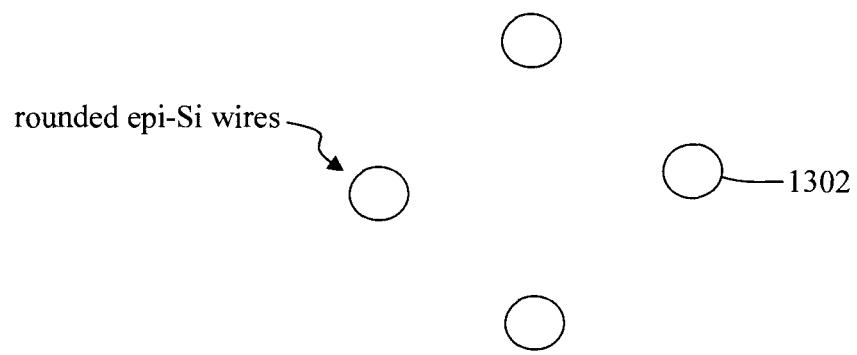
FIG. 15 is a cross-sectional diagram illustrating the epi-Si wires having been re-shaped to give them a round cross-sectional shape according to an embodiment of the present invention.
Figure 16:
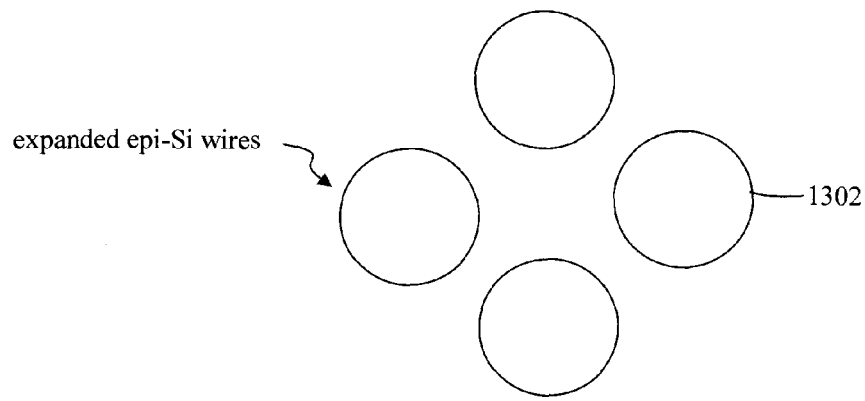
FIG. 16 is a cross-sectional diagram illustrating an Si-epi growth process having been used to expand out the epi-Si wires to increase their diameter according to an embodiment of the present invention.

As provided above, if so desired additional processing of the epi-wires 502 may be performed. For instance, as shown in FIG. 15, the epi-Si wires 1302 may be re-shaped to give them a round cross-sectional shape. Suitable techniques for reshaping nanowires are described in U.S. Pat. No. 7,884,004. See above.

As shown in FIG. 15, the reshaping process also serves to thin the epi-Si wires 1302. Thus, if so desired, an Si-epi growth process can be used to expand out the epi-Si wires 1302 to increase their diameter. See FIG. 16. However, it is preferable to control the epi expansion so as not to merge the separate epi-Si wires back into a single wire.

As provided above, in an alternative embodiment of the present techniques the starting nanowires are not released from the underlying BOX prior to growth of the epi-wires. In that case, only three sides (i.e., top and two sides) of the starting nanowire are exposed. As a result, in that case three epi-wires will be produced (i.e., the present process is a pitch tripling process). The starting nanowires can be released from the BOX (in the same manner as described above) following growth of the epi-wires. An advantage to this alternative process flow is that delaying release of the nanowires from the BOX provides access for removal of the starting nanowire (i.e., the bottom of the starting nanowire has no epi and will be exposed once released from the underlying BOX) without having to etch back the epi (as done above). Thus, the overall number of processing steps is reduced.

This alternative exemplary embodiment is now described in detail by way of reference to FIGS. 17-21. It is notable that the example depicted in FIGS. 17-21 involves a Si starting nanowire and the formation of multiple epi-SiGe wires. However, as noted above, with minor adaptation the same basic process applies in the alternative case involving SiGe starting nanowires for the growth of multiple epi-Si wires. Thus, one skilled in the art given the present description would be able to adapt the following process to this alternative situation to begin with SiGe rather than Si nanowires.

Figure 17:
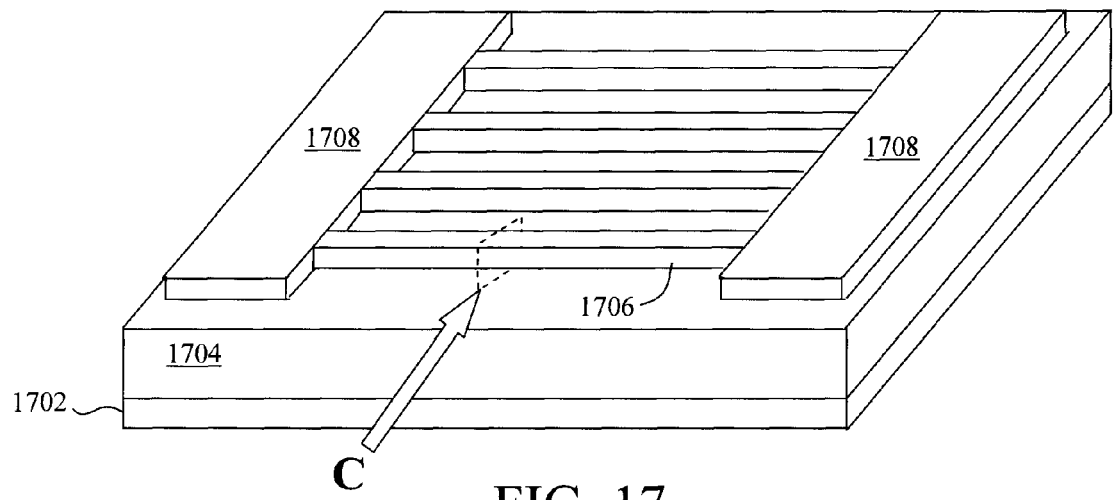
FIG. 17 is a three-dimensional diagram illustrating Si nanowire(s) and pads having been patterned in a SOI layer of a SOI wafer over a BOX wherein the nanowires are resting on the BOX according to an embodiment of the present invention.

As shown in FIG. 17, the stating structure for this alternative process flow is the same as that for the previous embodiments except for the fact that the nanowires 1706 are not initially released from the BOX 1704. Specifically, to begin the process, nanowire(s) 1706 and pads 1708 are patterned in an SOI layer of a SOI wafer. In this case the SOI wafer is a Si-on-insulator wafer (i.e., the SOI layer of the SOI wafer is formed from Si). In this example, the Si SOI layer is separated from a substrate 1702 by a BOX 1704. See FIG. 17. Processes for patterning the nanowires and pads in the SOI layer were provided above.

As shown in FIG. 17, one possible configuration of the nanowires 1706 and pads 1708 is a ladder-like structure wherein the nanowires 1706 connect the pads 1708 like the rungs of a ladder. The present techniques are however more generally applicable to any nanowire configuration including, e.g., those having a single nanowire and/or those where pads are provided to each nanowire individually. In contrast to the examples above, the nanowires 1706 are not yet released from the BOX 1704.

Figure 18:
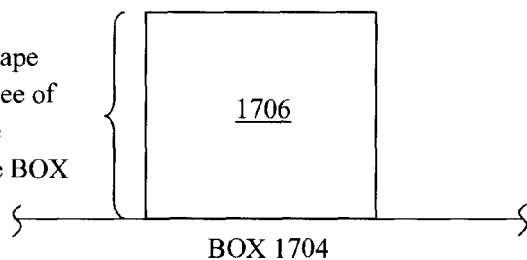
FIG. 18 is a cross-sectional diagram illustrating the Si nanowires having a square cross-sectional shape with three flat exposed surfaces according to an embodiment of the present invention.
Figure 19:
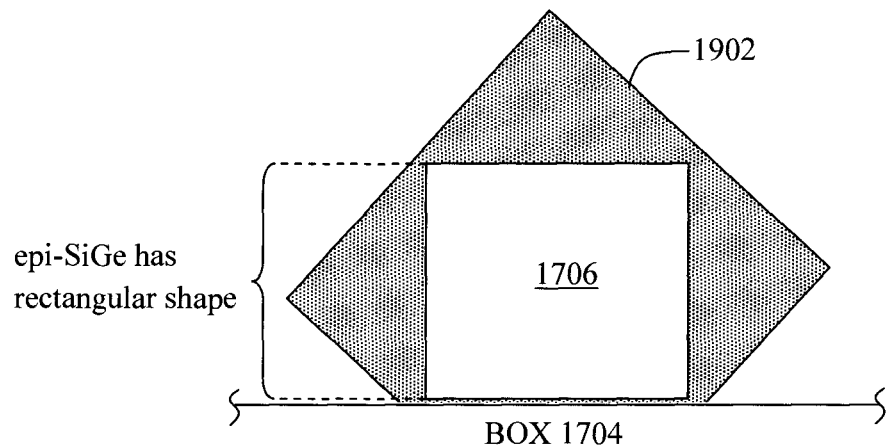
FIG. 19 is a cross-sectional diagram illustrating epi-SiGe having been grown on the three flat exposed surfaces of the Si nanowires according to an embodiment of the present invention.

For ease and clarity of description, the depictions in the figures will now shift to that of a cross-sectional cut through one of the nanowires 1706. Specifically, what is depicted in FIGS. 18, 19, etc. is a cross-sectional cut C through one of the nanowires 1706 (see FIG. 17) which in this case is resting on the BOX 1704. Thus, what is depicted in FIG. 18 is a cross-section of one of the nanowires 1706. As shown in FIG. 18, the nanowires 1706 have a square (cross-sectional) shape. However, in this case the nanowires 1706 are resting on the BOX 1704 (see FIG. 17) and thus only three flat sides of the nanowires 1706 are exposed on which selective growth of the epi-SiGe wires will be performed.

Specifically, as shown in FIG. 19, epitaxial SiGe ("epi-SiGe") 1902 is grown on the outside of the nanowires 1706. The growth is selective for forming epi-SiGe 1902 on the flat surfaces of the nanowires 1706 and, as described above the epi-SiGe on each flat surface of the nanowires 1706 takes on a rectangular cross-sectional shape. In this example it is these rectangular epi-Si structures that will ultimately form the epi-SiGe wires, one for each of the exposed sides (i.e., in this case three sides) of the nanowires 1706. Thus for each nanowire 1706 three epi-SiGe wires will be produced. The process for selective epitaxial growth on the flat surfaces of a nanowire was provided above.

Figure 20:
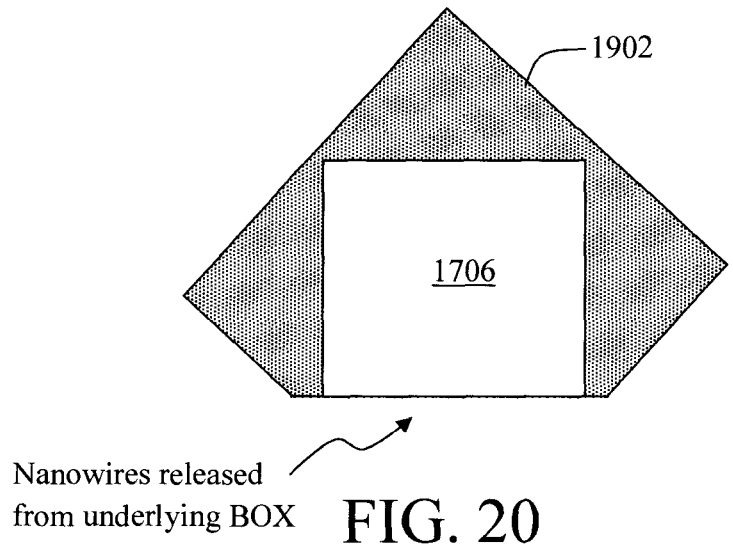
FIG. 20 is a cross-sectional diagram illustrating the Si nanowires having been released from the BOX exposing an underside of the nanowires not covered with epi-SiGe according to an embodiment of the present invention.

Next, as shown in FIG. 20, the nanowires 1706 can be released from the underlying BOX 1704. As provided above, recessing of the BOX can be achieved with a DHF etch. The DHF etch is isotropic. The lateral component of the etching undercuts the BOX under the narrow nanowires, however the large SOI pads are not released and remain attached to the BOX.

Figure 21:
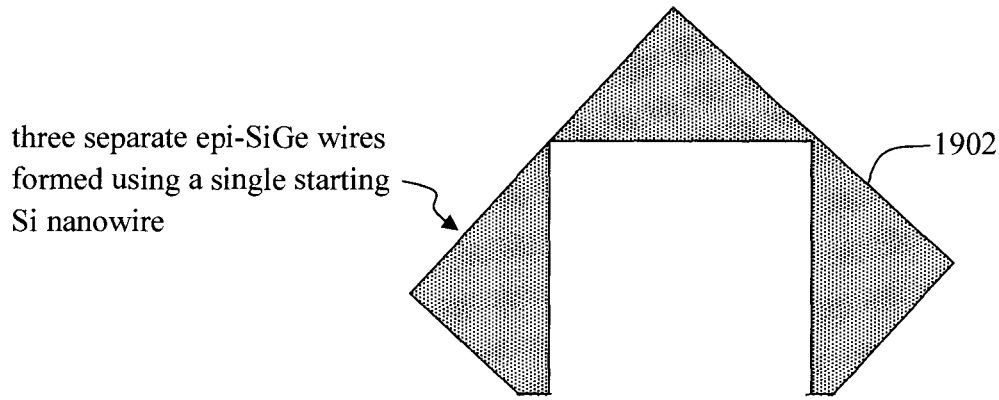
FIG. 21 is a cross-sectional diagram illustrating the Si nanowires having been removed selective to the epi-SiGe wires according to an embodiment of the present invention.

Advantageously, after release from the BOX each nanowire 1706 has an exposed surface which permits the nanowires to be selectively removed without the need for an etch back of the epi-SiGe. Thus, the portions of the epi-SiGe 1902 on the three flat sides of the nanowires 1706 are the epi-SiGe wires. Specifically, the next step in this alternative flow is to remove the nanowires 1706 selective to the epi-SiGe wires 1902. See FIG. 21. As shown in FIG. 21, the result is three separate epi-SiGe wires 1902 having been formed in place of each of the single original (Si) nanowires 1706 removed. Any further processing of the epi-SiGe wires (e.g., reshaping, expanding, etc.) would proceed in the same manner as described above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A pitch multiplication method for nanowires, the method comprising the steps of:
   providing a semiconductor-on-insulator (SOI) wafer having an SOI layer separated from a substrate by a buried oxide (BOX), wherein the SOI layer comprises silicon (Si);
   patterning at least one nanowire in the SOI layer, wherein the at least one nanowire as-patterned has a square cross-sectional shape with flat sides;
   growing epitaxial silicon germanium (SiGe) on an outside of the at least one nanowire using an epitaxial process that selectively grows the epitaxial SiGe on the flat sides of the at least one nanowire, wherein by way of the growing step the at least one nanowire is encapsulated in the epitaxial SiGe;
   etching back the epitaxial SiGe to expose the at least one nanowire; and
   removing the at least one nanowire selective to the epitaxial SiGe, wherein the epitaxial SiGe that remains comprises multiple epitaxial SiGe wires having been formed in place of the at least one nanowire that has been removed.

2. The pitch multiplication method of claim 1, wherein the epitaxial SiGe is etched back using an isotropic etching process selective for etching SiGe.

3. The pitch multiplication method of claim 1, wherein the at least one nanowire is removed selective to the epitaxial SiGe using a wet etching process.

4. The pitch multiplication method of claim 1, further comprising the step of:
   reshaping the multiple epitaxial SiGe wires to give the multiple epitaxial SiGe wires a round cross-sectional shape.

5. The pitch multiplication method of claim 4, further comprising the step of:
   increasing a diameter of the multiple epitaxial SiGe wires using an epitaxial growth process.

6. The pitch multiplication method of claim 1, wherein the step of patterning the at least one nanowire in the SOI layer comprises:

patterning pads in the SOI layer, wherein the at least one nanowire connects the pads to form a ladder-like structure.

7. The pitch multiplication method of claim 6, further comprising the step of:
   growing the epitaxial SiGe on the pads.

8. The pitch multiplication method of claim 1, wherein the at least one nanowire has four flat sides and wherein four of the multiple epitaxial SiGe wires are formed.

* * * * *